US012584967B2

(12) United States Patent
Jang et al.

(10) Patent No.: US 12,584,967 B2
(45) Date of Patent: Mar. 24, 2026

(54) APPARATUS FOR CORRECTING VOLTAGE OF BATTERY CELL AND METHOD THEREOF

(71) Applicants: Hyundai Motor Company, Seoul (KR); Kia Corporation, Seoul (KR)

(72) Inventors: Yoo Hong Jang, Suwon-Si (KR); Yoon Sung Choi, Hwaseong-Si (KR); Bo Hyun Lee, Incheon (KR); Sang Jin Lee, Goyang-Si (KR); Hyo Kyung Lee, Anyang-Si (KR); Yo Han Baek, Anyang-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 202 days.

(21) Appl. No.: 18/533,566

(22) Filed: Dec. 8, 2023

(65) Prior Publication Data

US 2025/0076392 A1 Mar. 6, 2025

(30) Foreign Application Priority Data

Sep. 4, 2023 (KR) ........................ 10-2023-0117178

(51) Int. Cl.
| | |
|---|---|
| *G01R 31/3835* | (2019.01) |
| *G01R 31/36* | (2020.01) |
| *G01R 31/396* | (2019.01) |
| *H01M 10/42* | (2006.01) |

(52) U.S. Cl.
CPC ..... *G01R 31/3835* (2019.01); *G01R 31/3648* (2013.01); *G01R 31/396* (2019.01); *H01M 10/4285* (2013.01)

(58) Field of Classification Search
CPC ........... G01R 31/3648; G01R 31/3835; G01R 31/396; G01R 31/3842; G01R 31/382; G01R 31/392; G01R 31/389; G01R 31/36; G01R 31/3647; G01R 19/16542; G01R 19/12; G01R 31/385; G01R 31/378; H01M 10/4285; Y02E 60/10
See application file for complete search history.

(56) References Cited

U.S. PATENT DOCUMENTS

| | | | | |
|---|---|---|---|---|
| 6,892,148 | B2 * | 5/2005 | Barsoukov .......... | H01M 10/482 |
| | | | | 702/65 |
| 8,415,954 | B2 * | 4/2013 | Akamine ........... | G01R 31/3828 |
| | | | | 324/426 |
| 9,041,405 | B2 * | 5/2015 | Sejima ................. | G01R 31/382 |
| | | | | 324/426 |
| 10,718,815 | B2 * | 7/2020 | Kim ..................... | G01R 31/392 |
| 11,646,588 | B2 * | 5/2023 | Sun ..................... | H02J 7/00036 |
| | | | | 320/137 |

* cited by examiner

*Primary Examiner* — Vinh P Nguyen
(74) *Attorney, Agent, or Firm* — MORGAN, LEWIS & BOCKIUS LLP

(57) ABSTRACT

In an apparatus for correcting a voltage of a battery cell and a method thereof. The apparatus includes a voltage sensor configured for measuring voltages of a plurality of battery cells, and a controller which is configured for determining an amount of voltage change of each battery cell corresponding to a preset discharge current, detects target battery cells whose identification numbers have preset intervals while the amount of voltage change does not exceed a threshold value, and corrects the amount of voltage change of each target battery cell.

18 Claims, 7 Drawing Sheets

APPARATUS FOR CORRECTING VOLTAGE OF BATTERY CELL AND METHOD THEREOF

CROSS-REFERENCE TO RELATED APPLICATION

The present application claims priority to Korean Patent Application No. 10-2023-0117178, filed on Sep. 4, 2023, the entire contents of which is incorporated herein all purposes by this reference. For all purposes by this reference.

BACKGROUND OF THE PRESENT DISCLOSURE

Field of the Present Disclosure

The present disclosure relates to a technology for correcting a measurement error of a voltage sensor depending on the fastening position of each battery cell forming a battery pack.

Description of Related Art

Generally, a battery pack used in an energy storage system (ESS) and an electric vehicle (EV) may form a preset number of groups in which a plurality of battery cells are connected in parallel to each other to increase current capacity, and a include a structure in which the groups are connected in series to output a rated voltage.

In the instant case, a battery cell may include a positive electrode current collector, a negative electrode current collector, a separator, an active material, an electrolyte, and the like and be repeatedly charged and discharged through electrochemical reactions between the components. To protect a plurality of battery cells from external shocks such as heat and vibration, a battery module may be formed by combining the plurality of battery cells into one. To systematically manage a plurality of battery modules, a battery pack (i.e., a battery system) may be configured using the plurality of battery modules, a battery management system (BMS), and a cooling device.

Because the internal resistance of a battery cell is an indicator which may be used for safety diagnosis of the battery cell, the voltage of the battery cell used to calculate the internal resistance of the battery cell may be measured with high accuracy. However, while the battery cells were normal and the voltage sensor was also normal, it was discovered that an error occurred in the measured value of the voltage sensor depending on the fastening location of each battery cell forming the battery pack.

In battery cells where measurement errors of the voltage sensor occur, the errors occur with a specific pattern (or rule) rather than randomly. Accordingly, there is a need to provide a method that detects battery cells in which a measurement error of a voltage sensor occurs based on such a specific pattern, and corrects the voltages of the detected battery cells.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing an apparatus for correcting a voltage of a battery cell and a method thereof which may detect the voltage of each battery cell with high accuracy and allow battery cells that were excluded from safety diagnosis targets due to low internal resistance measurement to be included in the safety diagnosis targets by determining an amount of voltage change of each battery cell corresponding to a preset discharge current, detecting battery cells included in a specific pattern while the amount of voltage change does not exceed a threshold value, and correcting the amount of voltage change (or voltage) of each target battery cell.

Another aspect of the present disclosure provides an apparatus for correcting a voltage of a battery cell and a method thereof which may detect the voltage of each battery cell with high accuracy and allow battery cells that were excluded from safety diagnosis targets due to low internal resistance measurement to be included in the safety diagnosis targets by including a lookup table in which compensation voltage values are recorded for each discharge current, determining the amount of voltage change of each battery cell corresponding to the preset discharge current, detecting battery cells whose amounts of voltage change do not exceed the threshold value, and correcting amounts of voltage changes of battery cells based on the lookup table.

Yet another aspect of the present disclosure provides an apparatus for correcting a voltage of a battery cell and a method thereof which may detect the voltage of each battery cell with high accuracy and allow battery cells that were excluded from safety diagnosis targets due to low internal resistance measurement to be included in the safety diagnosis targets by including a lookup table in which compensation voltage values are recorded for each discharge current, determining the amount of voltage change of each battery cell corresponding to the preset discharge current, detecting battery cells included in a specific pattern while the amount of voltage change does not exceed a threshold value, and correcting the amount of voltage change of each battery cell based on the lookup table.

Yet another aspect of the present disclosure provides an apparatus for correcting a voltage of a battery cell and a method thereof which may detect the voltage of each battery cell with high accuracy and allow battery cells that were excluded from safety diagnosis targets due to low internal resistance measurement to be included in the safety diagnosis targets by determining the amount of voltage change of each battery cell corresponding to the preset discharge current, detecting battery cells included in a specific pattern while the amount of voltage change does not exceed a threshold value, determining a first average value of each voltage change amount of battery cells not included in the specific pattern and a second average value of each voltage change amount of battery cells included in the specific pattern, and correcting each voltage change amount of the battery cells included in the specific pattern based on a value obtained by subtracting the second average value from the first average value.

The technical problems to be solved by the present disclosure are not limited to the aforementioned problems, and any other technical problems not mentioned herein will be clearly understood from the following description by those skilled in the art to which the present disclosure pertains. Also, it may be easily understood that the objects and advantages of the present disclosure may be realized by the units and combinations thereof recited in the claims.

According to an aspect of the present disclosure, an apparatus for correcting a voltage of a battery cell includes a voltage sensor configured for measuring voltages of a plurality of battery cells, and a controller which is configured for determining an amount of voltage change of each battery cell corresponding to a preset discharge current, detects target battery cells whose identification numbers have preset intervals while the amount of voltage change does not exceed a threshold value, and corrects the amount of voltage change of each target battery cell.

According to an exemplary embodiment of the present disclosure, the controller may be configured to determine a difference between a voltage of the battery cell before discharging and a voltage of the battery cell during discharging with the discharge current as the amount of voltage change of the battery cell.

According to an exemplary embodiment of the present disclosure, the apparatus may further include storage that stores a lookup table in which a compensation voltage value is recorded for each discharge current.

According to an exemplary embodiment of the present disclosure, the compensation voltage value may a include a larger value as the discharge current increases.

According to an exemplary embodiment of the present disclosure, the controller may correct the amount of voltage change of each target battery cell based on the lookup table.

According to an exemplary embodiment of the present disclosure, the controller may search the lookup table for the compensation voltage value corresponding to the preset discharge current and add the compensation voltage value to the amount of voltage change of each target battery cell.

According to an exemplary embodiment of the present disclosure, the controller may be configured to determine a first average value of each voltage change amount of remaining battery cells excluding the target battery cells, determine a second average value of each voltage change amount of the target battery cells, and correct the amount of voltage change of each target battery cell based on a value obtained by subtracting the second average value from the first average value.

According to an exemplary embodiment of the present disclosure, the controller may be configured to determine a first average value of each voltage change amount of remaining battery cells excluding the target battery cells, determine a second average value of each voltage change amount of the target battery cells, determine a compensation value by subtracting the second average value from the first average value, and add the compensation value to the amount of voltage change of each target battery cell.

According to another aspect of the present disclosure, a method of correcting a voltage of a battery cell includes measuring, by a voltage sensor, voltages of a plurality of battery cells, determining, by a controller, an amount of voltage change of each battery cell corresponding to a preset discharge current, detecting, by the controller, target battery cells whose identification numbers have preset intervals while the amount of voltage change does not exceed a threshold value, and correcting, by the controller, the amount of voltage change of each target battery cell.

According to an exemplary embodiment of the present disclosure, the determining of the amount of voltage change of each battery cell may include determining, by the controller, a difference between a voltage of the battery cell before discharging and a voltage of the battery cell during discharging with the discharge current as the amount of voltage change of the battery cell.

According to an exemplary embodiment of the present disclosure, the method may further include storing, by storage, a lookup table in which a compensation voltage value is recorded for each discharge current.

According to an exemplary embodiment of the present disclosure, the correcting of the amount of voltage change of each target battery cell may include correcting, by the controller, the amount of voltage change of each target battery cell based on the lookup table.

According to an exemplary embodiment of the present disclosure, the correcting of the amount of voltage change of each target battery cell may include searching, by the controller, the lookup table for the compensation voltage value corresponding to the preset discharge current, and adding, by the controller, the compensation voltage value to the amount of voltage change of each target battery cell.

According to an exemplary embodiment of the present disclosure, the correcting of the amount of voltage change of each target battery cell may include determining, by the controller, a first average value of each voltage change amount of remaining battery cells excluding the target battery cells, determining, by the controller, a second average value of each voltage change amount of the target battery cells, and correcting, by the controller, the amount of voltage change of each target battery cell based on a value obtained by subtracting the second average value from the first average value.

According to an exemplary embodiment of the present disclosure, the correcting of the amount of voltage change of each target battery cell includes determining, by the controller, a first average value of each voltage change amount of remaining battery cells excluding the target battery cells, determining, by the controller, a second average value of each voltage change amount of the target battery cells, determining, by the controller, a compensation value by subtracting the second average value from the first average value, and adding, by the controller, the compensation value to the amount of voltage change of each target battery cell.

The methods and apparatuses of on the present disclosure have other features and advantages which will be apparent from or are set forth in more detail in the accompanying drawings, which are incorporated herein, and the following Detailed Description, which together serve to explain predetermined principles of on the present disclosure.

Figure 1:
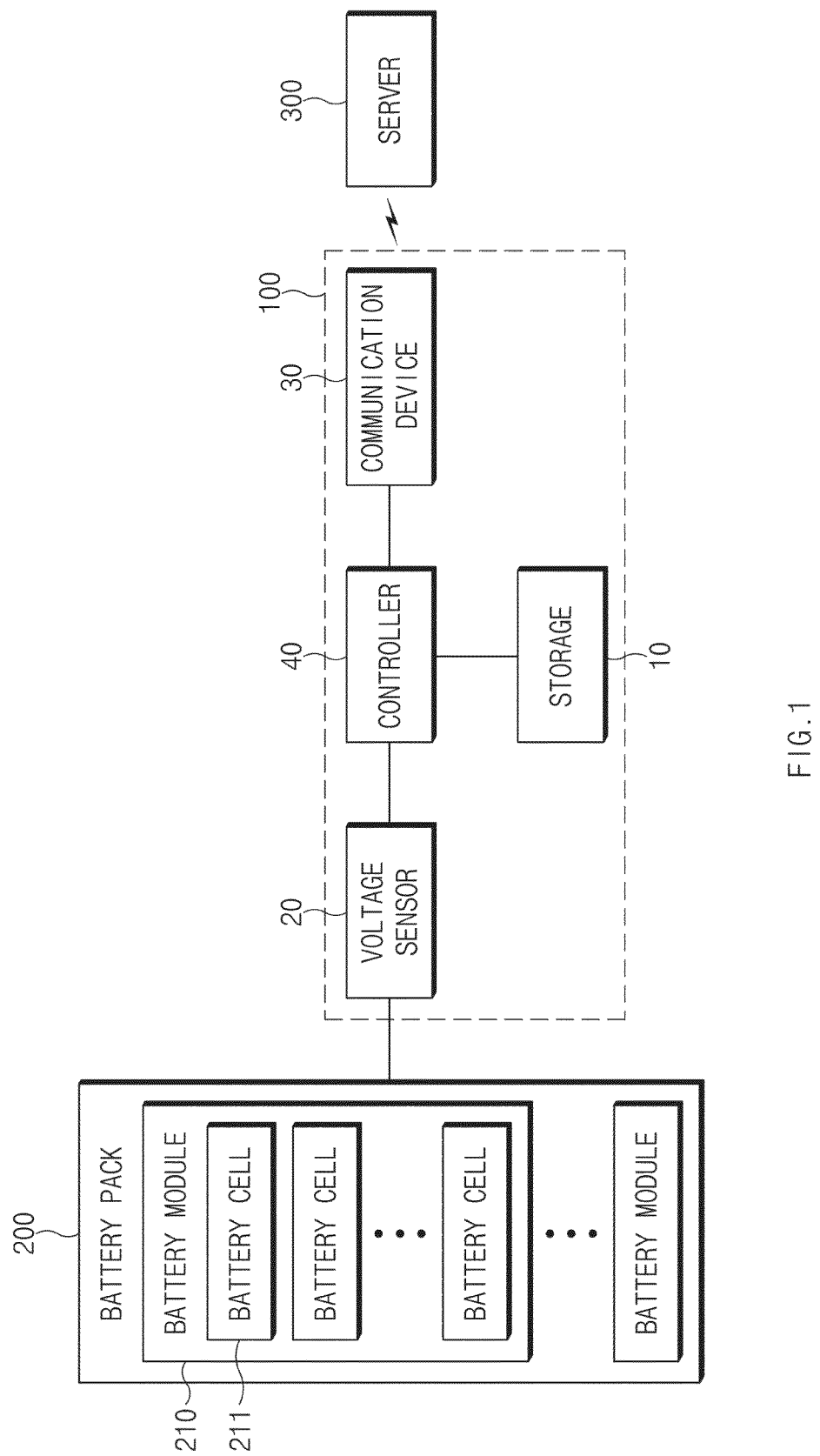
FIG. 1 is a block diagram illustrating an apparatus for correcting a voltage of a battery cell according to an exemplary embodiment of the present disclosure.

It may be understood that the appended drawings are not necessarily to scale, presenting a somewhat simplified representation of various features illustrative of the basic principles of the present disclosure. The specific design features of on the present disclosure as included herein, including, for example, specific dimensions, orientations, locations, and shapes will be determined in part by the particularly intended application and use environment.

In the figures, reference numbers refer to the same or equivalent parts of on the present disclosure throughout the several figures of the drawing.

DETAILED DESCRIPTION

Reference will now be made in detail to various embodiments of on the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, various exemplary embodiments of the present disclosure will be described in detail with reference to the exemplary drawings. In adding the reference numerals to the components of each drawing, it should be noted that the identical or equivalent component is designated by the identical numeral even when they are displayed on other drawings. Furthermore, in describing the exemplary embodiment of the present disclosure, a detailed description of the related known configuration or function will be omitted when it is determined that it interferes with the understanding of the exemplary embodiment of the present disclosure.

Furthermore, terms, such as first, second, A, B, (a), (b) or the like may be used herein when describing components of the present disclosure. The terms are provided only to distinguish the elements from other elements, and the essences, sequences, orders, and numbers of the elements are not limited by the terms. Furthermore, unless defined otherwise, all terms used herein, including technical or scientific terms, include the same meanings as those generally understood by those skilled in the art to which the present disclosure pertains. The terms defined in the generally used dictionaries should be construed as including the meanings that coincide with the meanings of the contexts of the related technologies, and should not be construed as ideal or excessively formal meanings unless clearly defined in the specification of the present disclosure.

FIG. 1 is a block diagram illustrating an apparatus for correcting a voltage of a battery cell according to an exemplary embodiment of the present disclosure.

As shown in FIG. 1, an apparatus 100 for correcting a voltage of a battery cell according to an exemplary embodiment of the present disclosure may include storage 10, a voltage sensor 20, a communication device 30, and a controller 40. In the instant case, depending on a scheme of implementing the apparatus 100 for correcting a voltage of a battery cell according to an exemplary embodiment of the present disclosure, components may be combined with each other to be implemented as one, or some components may be omitted.

Regarding each component, the storage 10 may store various logic, algorithms and programs required in the processes of determining an amount of voltage change of each battery cell corresponding to a preset discharge current, detecting battery cells included in a specific pattern while the amount of voltage change does not exceed a threshold value, and correcting the amount of voltage change (or voltage) of each target battery cell.

The storage 10 may store a lookup table in which compensation voltage values are recorded for each discharge current. In the instant case, an example of the lookup table is shown in following Table 1. In Table 1, C-rate means a discharge current.

TABLE 1

| C-rate | Compensation voltage value (mV) |
|--------|---------------------------------|
| 0.5    | 5                               |
| 1.0    | 7                               |
| 1.5    | 9                               |
| 2.0    | 11                              |
| 2.5    | 13                              |
| 3.0    | 15                              |

The storage 10 may store various logic, algorithms, and programs required in the processes of determining the amount of voltage change of each battery cell corresponding to the preset discharge current, detecting battery cells whose amounts of voltage change do not exceed the threshold value, and correcting amounts of voltage changes of battery cells based on the lookup table.

The storage 10 may store various logic, algorithms, and programs required in the processes of determining the amount of voltage change of each battery cell corresponding to the preset discharge current, detecting battery cells included in a specific pattern while the amount of voltage change does not exceed a threshold value, and correcting the amount of voltage change of each battery cell based on the lookup table.

The storage 10 may store various logic, algorithms, and programs required in the processes of determining the amount of voltage change of each battery cell corresponding to the preset discharge current, detecting battery cells included in a specific pattern while the amount of voltage change does not exceed a threshold value, determining a first average value of each voltage change amount of battery cells not included in the specific pattern and a second average value of each voltage change amount of battery cells included in the specific pattern, and correcting each voltage change amount of the battery cells included in the specific pattern based on a value obtained by subtracting the second average value from the first average value.

The voltage sensor 20 may measure the voltage of each of the battery cells forming a battery pack 200. To the present end, the voltage sensor 20 may include a plurality of voltage sensor modules. In the instant case, the battery pack 200 is as shown in FIG. 2 and FIG. 3, as an example.

Figure 2:
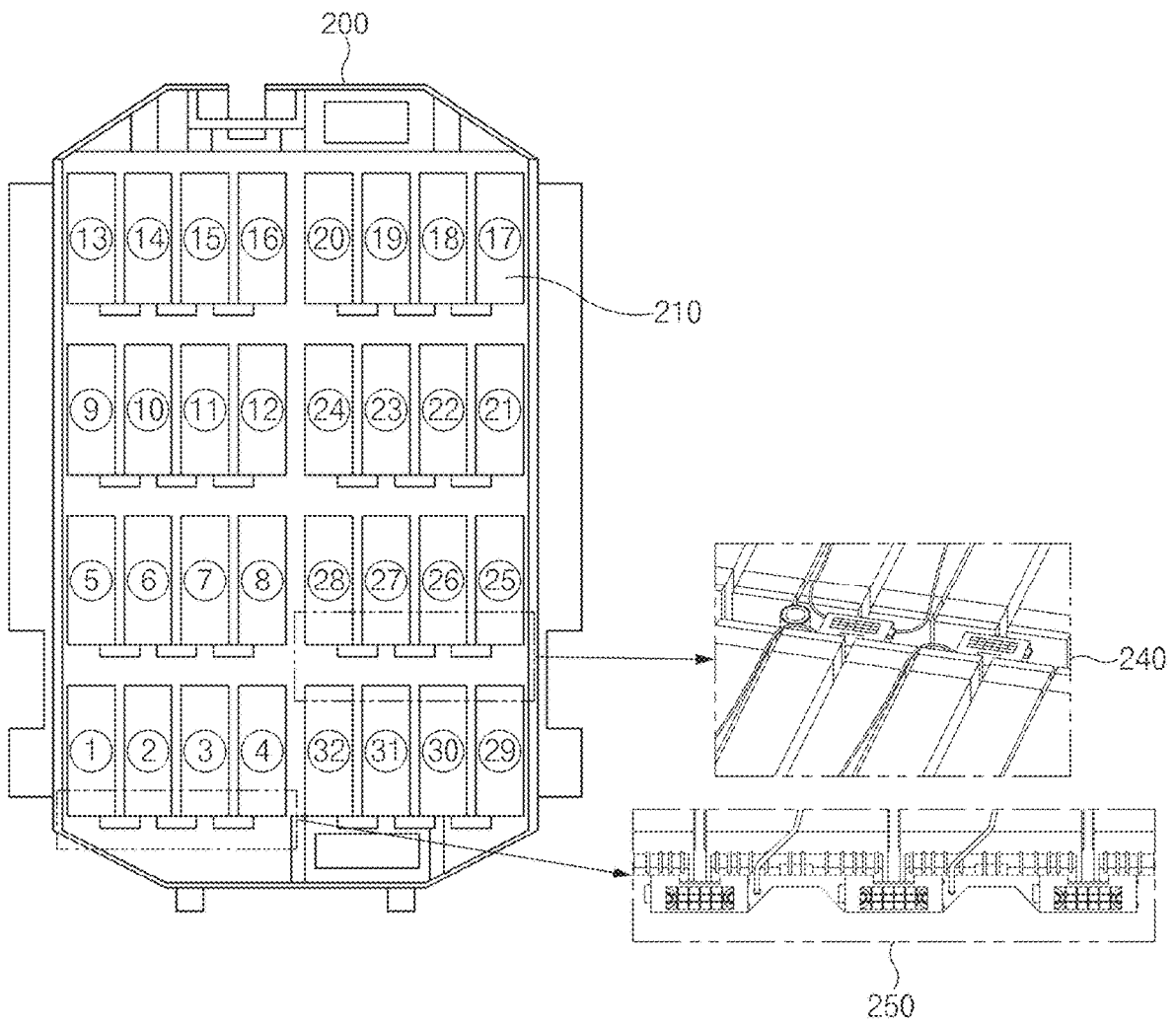
FIG. 2 is a structural diagram of a battery pack to which an apparatus for correcting a voltage of a battery cell according to an exemplary embodiment of the present disclosure is applied.
Figure 3:
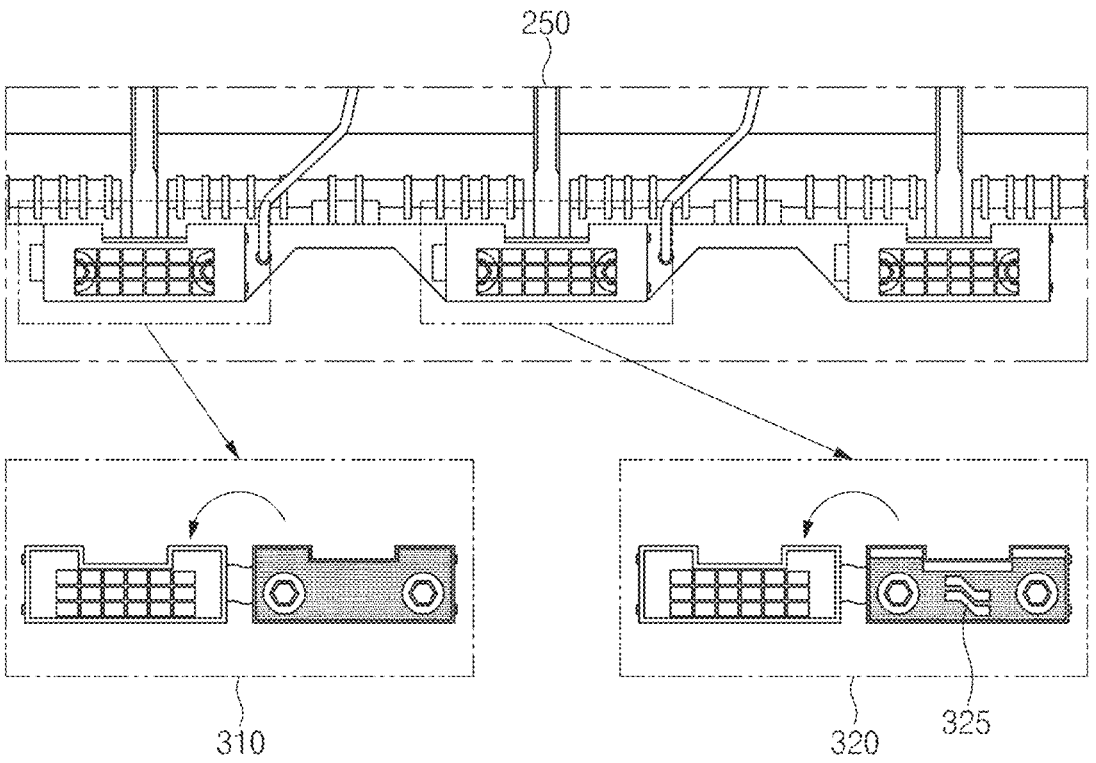
FIG. 3 is a structural diagram of a bus bar and a heat dissipation case of a battery pack to which an apparatus for correcting a voltage of a battery cell according to an exemplary embodiment of the present disclosure is applied.

FIG. 2 is a structural diagram of a battery pack to which an apparatus for correcting a voltage of a battery cell according to an exemplary embodiment of the present disclosure is applied.

As shown in FIG. 2, the battery pack 200 may include thirty two (32) battery modules 210 and each battery module 210 may include six (6) battery cells 211, so that the battery pack 200 may include one hundred ninety two (192) battery cells 211. In the instant case, reference numeral 240 represents the fastening state between battery modules, and reference numeral 250 represents the fastening state of the battery module located at the end portion of the battery pack 200.

For example, battery module ① may include battery cell C1, battery cell C2, battery cell C3, battery cell C4, battery cell C5, and battery cell C6, battery module ② may include battery cell C7, battery cell C8, battery cell C9, battery cell C10, battery cell C11, and battery cell C12, battery module ③ may include battery cell C13, battery cell C14, battery cell C15, battery cell C16, battery cell C17, and battery cell C18, battery module ④ may include battery cell C19, battery cell C20, battery cell C21, battery cell C22, battery cell C23, and battery cell C24, and battery module ⑤ may include battery cell C25, battery cell C26, battery cell C27, battery cell C28, battery cell C29, and battery cell C30.

FIG. 3 is a structural diagram of a bus bar and a heat dissipation case of a battery pack to which an apparatus for correcting a voltage of a battery cell according to an exemplary embodiment of the present disclosure is applied.

As shown in FIG. 3, the battery pack 200 may include a first bus bar 310 and a second bus bar 320. In the instant case, the first bus bar 310 includes a heat dissipation case, and a metal plate fastening two internal bolts includes a completely closed structure. The second bus bar 320 includes a heat dissipation case, and a metal plate fastening two internal bolts includes a hole 325. In the instant case, there is no hole in the portion of the metal plate of the second bus bar 320 which is in direct contact with the bolt.

The communication device 30, which is a module for providing a communication interface with an external device such as a display or a server 300, may transmit information on battery cells with an amount of voltage change corrected as well as diagnostic results of the battery cells to the display or the external server 300. In the instant case, the external server 300 may include a vehicle management server, a vehicle battery management server, and the like. The communication device 30 may include at least one of a mobile communication module, a wireless Internet module, and a short-range communication module.

The mobile communication module may communicate with the server 300 through a mobile communication network constructed according to a technical standard or communication scheme for mobile communication (e.g., Global System for Mobile communication (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), High Speed Uplink Packet Access (HSUPA), Long Term Evolution (LTE), Long Term Evolution-Advanced (LTEA), and the like).

The wireless Internet module, which is a module for wireless Internet access, may communicate with the server 300 through wireless LAN (WLAN), wireless-fidelity (Wi-Fi), Wi-Fi direct, Digital Living Network Alliance (DLNA), Wireless Broadband (WiBro), Worldwide Interoperability for Microwave Access (WiMAX), high speed downlink packet access (HSDPA), High Speed Uplink Packet Access (HSUPA), Long Term Evolution (LTE), Long Term Evolution-Advanced (LTE-A), and the like.

The short-range communication module may support short-range communication with the server 300 by use of at least one of Bluetooth™, radio frequency identification (RFID), infrared data association (IrDA), ultra wideband (UWB), ZigBee, Near Field Communication (NFC), and wireless universal serial bus (USB) technology.

The controller 40 may perform overall control such that each component performs its function. The controller 40 may be implemented in a form of hardware or software, or may be implemented in a combination of hardware and software. The controller 40 may be implemented as a microprocessor, but is not limited thereto.

The controller 40 may be configured to determine an amount of voltage change of each battery cell corresponding to the preset discharge current, detect battery cells included in a specific pattern while the amount of voltage change does not exceed a threshold value, and correct the amount of voltage change (or voltage) of each target battery cell.

The controller 40 may be configured to determine the amount of voltage change of each battery cell corresponding to the preset discharge current, detect battery cells in which the amounts of voltage change do not exceed the threshold value, and correct amounts of voltage changes of battery cells based on the lookup table stored in the storage 10.

The controller 40 may be configured to determine the amount of voltage change of each battery cell corresponding to the preset discharge current, detect battery cells included in a specific pattern while the amount of voltage change does not exceed a threshold value, and correct the amount of voltage change of each battery cell based on the lookup table stored in the storage 10.

The controller 40 may search the lookup table for a compensation voltage value corresponding to a preset discharge current and add the compensation voltage value to the amount of voltage change of each target battery cell.

The controller 40 may be configured to determine the amount of voltage change of each battery cell corresponding to the preset discharge current, detect battery cells included in a specific pattern while the amount of voltage change does not exceed a threshold value, determine the first average value of each voltage change amount of battery cells not included in the specific pattern and the second average value of each voltage change amount of battery cells included in the specific pattern, and correct each voltage change amount of the battery cells included in the specific pattern based on the value obtained by subtracting the second average value from the first average value.

The controller 40 may be configured to determine the first average value of each voltage change amount of battery cells not included in the specific pattern, determine the second average value of each voltage change amount of battery cells included in the specific pattern, determine a compensation value by subtracting the second average value from the first average value, and add the compensation value to each voltage change amount of battery cells included in the specific pattern.

Hereinafter, the operation of the controller 40 will be described in detail with reference to FIG. 4 and FIG. 5.

Figure 4:
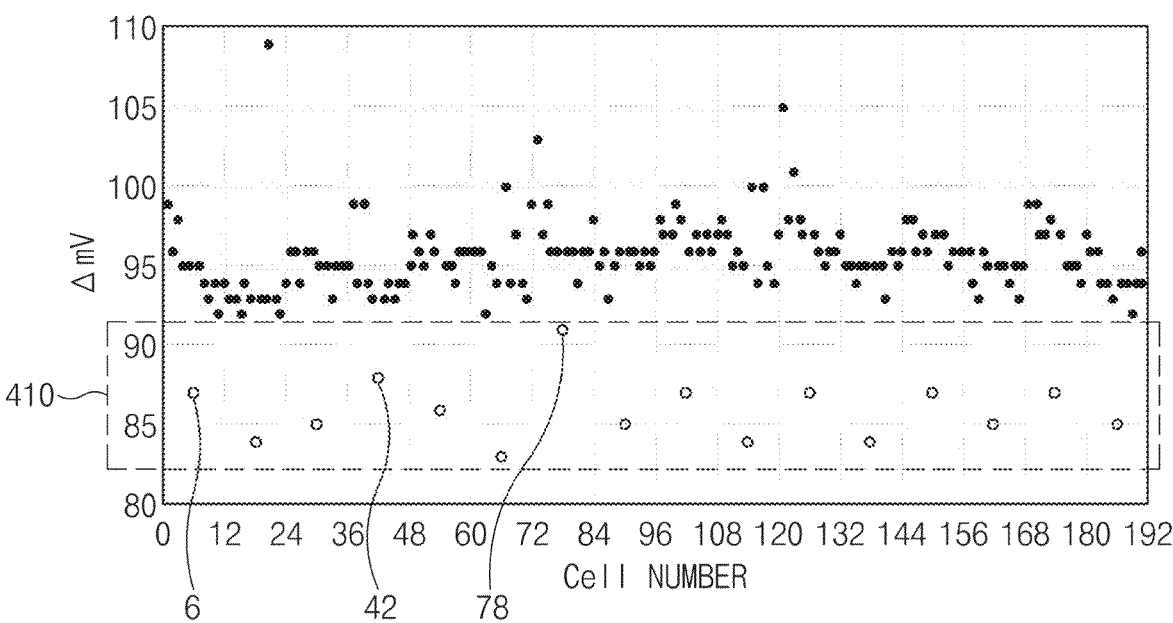
FIG. 4 is a diagram illustrating a process of detecting target battery cells by a controller provided in an apparatus for correcting a voltage of a battery cell according to an exemplary embodiment of the present disclosure.

FIG. 4 is a diagram illustrating a process of detecting target battery cells by a controller provided in an apparatus for correcting a voltage of a battery cell according to an exemplary embodiment of the present disclosure.

As shown in FIG. 4, when a discharge current of 2C (Coulomb) is applied to the battery pack 200 between 0 and 0.1 seconds (i.e., the battery pack 200 outputs (discharges) the discharge current of 2C), the amount of voltage change of each battery cell 211 determined by the controller 40 is shown. In the instant case, the horizontal axis represents the identification number of each battery cell 211, and the vertical axis represents the amount (ΔmV) of voltage change of each battery cell 211. Furthermore, the amount of voltage change represents a value obtained by subtracting the voltage at 0 seconds from the voltage at 0.1 seconds, or a value obtained by subtracting the voltage at 0.1 seconds from the voltage at 0 seconds.

In FIG. 4, each battery cell 211 is divided into three groups. The first group included in the range of 91 mV to 99 mV shows a normal voltage change. However, the second group, which has a voltage change of 99 mV or more, and the third group 410, which has a voltage change of 91 mV or less, show abnormal voltage changes. In the instant case, each battery cell 211 included in the second group shows a high voltage change (i.e., internal resistance) and is not subject to correction because it is managed as a safety diagnosis subject.

However, each battery cell 211 included in the third group 410 is recognized as having lower internal resistance than it actually is, and is therefore not included in a safety diagnosis target. The reason why the present phenomenon occurs is due to the fastening location of each battery cell 211 forming the battery pack 200. In the instant case, it may be understood that the voltage change amounts of battery cell No. 6, battery cell No. 42, and battery cell No. 78 included in the third group 410 are relatively high compared to other battery cells included in the third group 410 even though the voltage change amounts were measured to be lower than actual amounts.

It may be understood through FIG. 4 that the battery cells included in the third group 410 are C6, C18, C30, C42, C54, . . . , C174, and C186. Regarding the battery module including the battery cells of the third group 410 with reference to FIG. 2, battery cell C6 is disposed in battery module ①, battery cell C18 is included in battery module ③, battery cell C30 is included in battery module ⑤, battery cell C42 is included in battery module ⑦, battery cell C54 is included in battery module ⑨. This corresponds to a specific fastening location in FIG. 2 (e.g., the first column, third column, sixth column, and eighth column from the left). The battery cells included in the third group 410 are included in a specific pattern. In the instant case, the specific pattern means that the identification numbers of each battery cell have a predetermined interval (e.g., 6, 12, 18, or the like).

The controller 40 may be configured to determine the battery cells of the third group 410 that occur with a specific pattern as correction targets (i.e., target battery cells). In the instant case, for example, the controller 40 may be configured to determine whether the battery cells included in the third group 410 are included in a specific pattern P based on following Equation 1.

$$P = a \times n \quad \text{[Equation 1]}$$

Where 'a' is a natural number and 'n' is the constant number of battery cells 211 included in the battery module 210. For instance, the constant number is 6.

Figure 5:
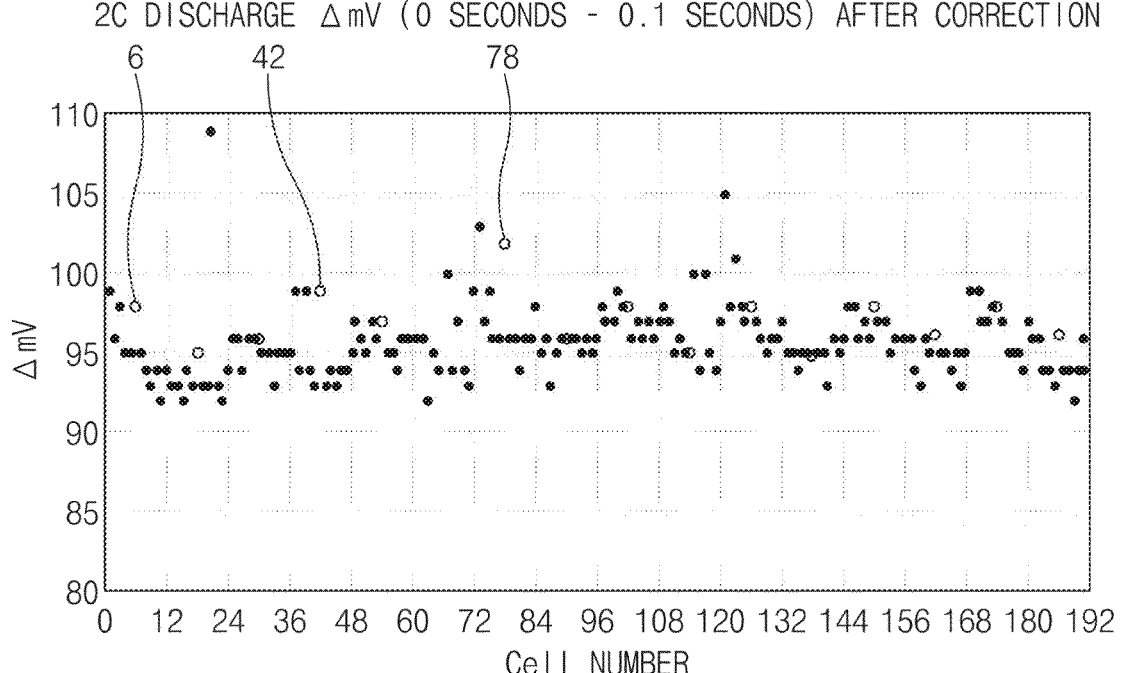
FIG. 5 is a diagram illustrating a result of correcting an amount of voltage change of each target battery cell by a controller provided in an apparatus for correcting a voltage of a battery cell according to an exemplary embodiment of the present disclosure.

FIG. 5 is a diagram illustrating a result of correcting an amount of voltage change of each target battery cell by a controller provided in an apparatus for correcting a voltage of a battery cell according to an exemplary embodiment of the present disclosure.

As shown in FIG. 5, the controller 40 may correct the amount of voltage change of target battery cells in the following two manners.

In an exemplary embodiment of the present disclosure, the controller 40 may apply a compensation voltage value (e.g., the identification number 11 corresponding to 2C) derived through Table 1 for battery cells included in the third group 410. That is, the controller 40 may add 11 to the amount of voltage change of each battery cell included in the third group 410.

As an exemplary embodiment of the present disclosure, the controller 40 may be configured to determine the average value (hereinafter, the first average value) of each voltage change amount of battery cells not included in the third group 410, determine the average value (hereinafter, the second average value) of each voltage change amount of the battery cells included in the third group 410, determine a value (hereinafter, a correction value) obtained by subtracting the second average value from the first average value, and add the correction value to the voltage change amount of each battery cell included in the third group 410.

As understood through FIG. 5, it may be understood that all battery cells included in the third group 410 move to the first or second group. In the instant case, battery cell No. 6, battery cell No. 42, and battery cell No. 78 have relatively high voltage changes within the third group 410, so there is a high possibility that they are defective. Because battery cells No. 6, battery cell No. 42, and battery cell No. 78 move to the second group, they may be included in the safety diagnosis target. In the instant case, it is possible to clearly determine whether battery cell No. 6, battery cell No. 42, and battery cell No. 78 are defective in the safety diagnosis process.

Figure 6:
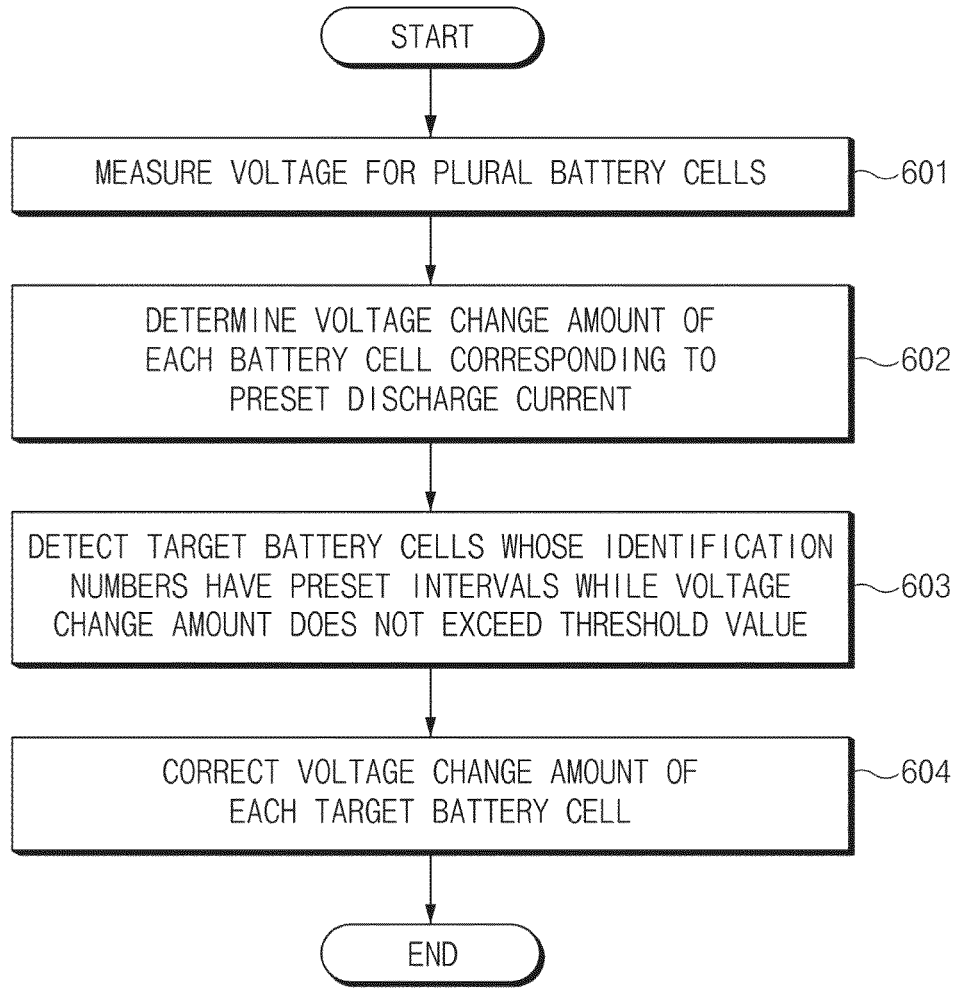
FIG. 6 is a flowchart illustrating a method of correcting a voltage of a battery cell according to an exemplary embodiment of the present disclosure.

FIG. 6 is a flowchart illustrating a method of correcting a voltage of a battery cell according to an exemplary embodiment of the present disclosure.

First, in 601, the voltage sensor 20 measures voltage for the plurality of battery cells 211.

Accordingly, in 602, the controller 40 is configured to determine the amount of voltage change of each battery cell 211 corresponding to the preset discharge current.

Accordingly, in 603, the controller 40 detects the target battery cells whose identification numbers have preset intervals while the amount of voltage change does not exceed the threshold value.

Accordingly, in 604, the controller 40 corrects the amount of voltage change of each target battery cell.

Figure 7:
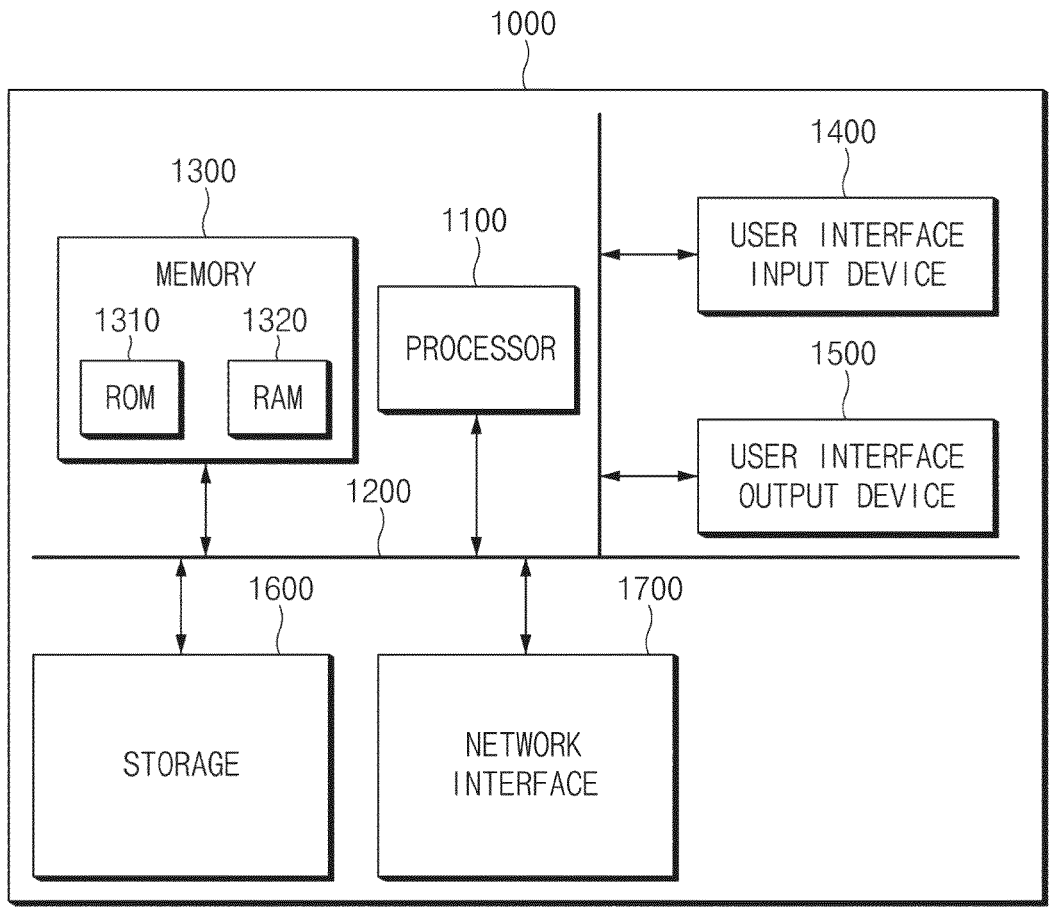
FIG. 7 is a block diagram illustrating a computing system for executing a method of correcting a voltage of a battery cell according to an exemplary embodiment of the present disclosure.

FIG. 7 is a block diagram illustrating a computing system for executing a method of correcting a voltage of a battery cell according to an exemplary embodiment of the present disclosure.

Referring to FIG. 7, a method of correcting a voltage of a battery cell according to an exemplary embodiment of the present disclosure described above may be implemented through a computing system 1000. The computing system 1000 may include at least one processor 1100, a memory 1300, a user interface input device 1400, a user interface output device 1500, storage 1600, and a network interface 1700 connected through a bus 1200.

The processor 1100 may be a central processing unit (CPU) or a semiconductor device that processes instructions stored in the memory 1300 and/or the storage 1600. The memory 1300 and the storage 1600 may include various types of volatile or non-volatile storage media. For example, the memory 1300 may include a Read-Only Memory (ROM) 1310 and a Random Access Memory (RAM) 1320.

Accordingly, the processes of the method or algorithm described in relation to the exemplary embodiments of the present disclosure may be implemented directly by hardware executed by the processor 1100, a software module, or a combination thereof. The software module may reside in a storage medium (that is, the memory 1300 and/or the storage 1600), such as a RAM, a flash memory, a ROM, an EPROM, an EEPROM, a register, a hard disk, solid state drive (SSD), a detachable disk, or a CD-ROM. The exemplary storage medium is coupled to the processor 1100, and the processor 1100 may read information from the storage medium and may write information in the storage medium. In another method, the storage medium may be integrated with the processor 1100. The processor 1100 and the storage medium may reside in an application specific integrated circuit (ASIC). The ASIC may reside in a user terminal. In another method, the processor 1100 and the storage medium may reside in the user terminal as an individual component.

According to the exemplary embodiments of the present disclosure, it is possible to detect the voltage of each battery cell with high accuracy and allow battery cells that were excluded from safety diagnosis targets due to low internal resistance measurement to be included in the safety diagnosis targets by determining an amount of voltage change of each battery cell corresponding to a preset discharge current, detecting battery cells included in a specific pattern while the amount of voltage change does not exceed a threshold value, and correcting the amount of voltage change (or voltage) of each target battery cell.

In various exemplary embodiments of the present disclosure, each operation described above may be performed by a control device, and the control device may be configured by a plurality of control devices, or an integrated single control device.

In various exemplary embodiments of the present disclosure, the memory and the processor may be provided as one chip, or provided as separate chips.

In various exemplary embodiments of the present disclosure, the scope of the present disclosure includes software or machine-executable commands (e.g., an operating system, an application, firmware, a program, etc.) for enabling operations according to the methods of various embodiments to be executed on an apparatus or a computer, a non-transitory computer-readable medium including such software or commands stored thereon and executable on the apparatus or the computer.

Furthermore, the terms such as "unit", "module", etc. included in the specification mean units for processing at least one function or operation, which may be implemented by hardware, software, or a combination thereof.

In an exemplary embodiment of the present disclosure, the vehicle may be referred to as being based on a concept including various means of transportation. In some cases, the vehicle may be interpreted as being based on a concept including not only various means of land transportation, such as cars, motorcycles, trucks, and buses, that drive on roads but also various means of transportation such as airplanes, drones, ships, etc.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

In the present specification, unless stated otherwise, a singular expression includes a plural expression unless the context clearly indicates otherwise.

In the exemplary embodiment of the present disclosure, it should be understood that a term such as "include" or "have" is directed to designate that the features, numbers, steps, operations, elements, parts, or combinations thereof described in the specification are present, and does not preclude the possibility of addition or presence of one or more other features, numbers, steps, operations, elements, parts, or combinations thereof.

The foregoing descriptions of predetermined exemplary embodiments of on the present disclosure have been presented for purposes of illustration and description. They are not intended to be exhaustive or to limit the present disclosure to the precise forms disclosed, and obviously many modifications and variations are possible in light of the above teachings. Ton the exemplary embodiments were chosen and described in order to explain certain principles of the invention and their practical application, to enable others skilled in the art to make and utilize various exemplary embodiments of on the present disclosure, as well as various alternatives and modifications thereof. It is intended that the scope of the present disclosure be defined by the claims appended hereto and their equivalents.

What is claimed is:

1. An apparatus for correcting a voltage of a battery cell, the apparatus comprising:
   a voltage sensor configured for measuring voltages of a plurality of battery cells; and
   a controller electrically and communicatively connected to the voltage sensor and configured to:
      determine an amount of voltage change of each battery cell corresponding to a preset discharge current;
      detect target battery cells whose identification numbers have preset intervals among the plurality of battery cells while the amount of voltage change does not exceed a threshold value; and
      correct the amount of voltage change of each target battery cell.

2. The apparatus of claim 1, wherein the controller is further configured to determine a difference between a voltage of each battery cell before discharging and a voltage of each battery cell during discharging with the discharge current as the amount of voltage change of each battery cell.

3. The apparatus of claim 1, further including:
   a storage electrically and communicatively connected to the controller and configured to store a lookup table in which a compensation voltage value is recorded for each discharge current.

4. The apparatus of claim 3, wherein the compensation voltage value has a larger value as the discharge current increases.

5. The apparatus of claim 3, wherein the controller is further configured to correct the amount of voltage change of each target battery cell based on the lookup table.

6. The apparatus of claim 3, wherein the controller is further configured to search the lookup table for the compensation voltage value corresponding to the preset discharge current and add the compensation voltage value to the amount of voltage change of each target battery cell.

7. The apparatus of claim 1, wherein the controller is further configured to determine a first average value of each voltage change amount of remaining battery cells excluding the target battery cells among the plurality of battery cells, determine a second average value of each voltage change amount of the target battery cells, and correct the amount of voltage change of each target battery cell based on a value obtained by subtracting the second average value from the first average value.

8. The apparatus of claim 1, wherein the controller is further configured to determine a first average value of each voltage change amount of remaining battery cells excluding the target battery cells among the plurality of battery cells, determine a second average value of each voltage change amount of the target battery cells, determine a compensation value by subtracting the second average value from the first average value, and add the compensation value to the amount of voltage change of each target battery cell.

9. The apparatus of claim 1, further including a communication device communicatively and electrically connected to the controller and configured for transmitting information on the battery cells with the corrected amount of voltage change to an external device.

10. A method of correcting a voltage of a battery cell, the method comprising:
    measuring, by a voltage sensor, voltages of a plurality of battery cells;
    determining, by a controller electrically and communicatively connected to the voltage sensor, an amount of voltage change of each battery cell corresponding to a preset discharge current;
    detecting, by the controller, target battery cells whose identification numbers have preset intervals among the plurality of battery cells while the amount of voltage change does not exceed a threshold value; and
    correcting, by the controller, the amount of voltage change of each target battery cell.

11. The method of claim 10, wherein the determining of the amount of voltage change of each battery cell includes:
    determining, by the controller, a difference between a voltage of each battery cell before discharging and a voltage of each battery cell during discharging with the discharge current as the amount of voltage change of each battery cell.

12. The method of claim 10, further including:
    storing, by a storage, a lookup table in which a compensation voltage value is recorded for each discharge current.

13. The method of claim 12, wherein the compensation voltage value has a larger value as the discharge current increases.

14. The method of claim 12, wherein the correcting of the amount of voltage change of each target battery cell includes:
    correcting, by the controller, the amount of voltage change of each target battery cell based on the lookup table.

15. The method of claim 12, wherein the correcting of the amount of voltage change of each target battery cell includes:
    searching, by the controller, the lookup table for the compensation voltage value corresponding to the preset discharge current; and
    adding, by the controller, the compensation voltage value to the amount of voltage change of each target battery cell.

16. The method of claim 10, wherein the correcting of the amount of voltage change of each target battery cell includes:
    determining, by the controller, a first average value of each voltage change amount of remaining battery cells excluding the target battery cells among the plurality of battery cells;
    determining, by the controller, a second average value of each voltage change amount of the target battery cells; and
    correcting, by the controller, the amount of voltage change of each target battery cell based on a value obtained by subtracting the second average value from the first average value.

17. The method of claim 10, wherein the correcting of the amount of voltage change of each target battery cell includes:
    determining, by the controller, a first average value of each voltage change amount of remaining battery cells excluding the target battery cells among the plurality of battery cells;
    determining, by the controller, a second average value of each voltage change amount of the target battery cells;
    determining, by the controller, a compensation value by subtracting the second average value from the first average value; and
    adding, by the controller, the compensation value to the amount of voltage change of each target battery cell.

18. The method of claim 10, further including:
    transmitting information on the battery cells with the corrected amount of voltage change to an external device.

* * * * *